United States Patent
Chang et al.

(10) Patent No.: US 12,464,772 B2
(45) Date of Patent: Nov. 4, 2025

(54) BURIED GATE STRUCTURES FOR SEMICONDUCTOR DEVICES

(71) Applicant: Taiwan Semiconductor Manufacturing Company, Ltd., Hsinchu (TW)

(72) Inventors: Hsaio-Chun Chang, Hsinchu County (TW); Guan-Jie Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 647 days.

(21) Appl. No.: 17/541,442

(22) Filed: Dec. 3, 2021

(65) Prior Publication Data

US 2022/0320308 A1     Oct. 6, 2022

Related U.S. Application Data

(60) Provisional application No. 63/168,346, filed on Mar. 31, 2021.

(51) Int. Cl.
| | |
|---|---|
| H10D 30/67 | (2025.01) |
| H10D 30/01 | (2025.01) |
| H10D 84/01 | (2025.01) |
| H10D 84/03 | (2025.01) |

(52) U.S. Cl.
CPC ....... *H10D 30/6735* (2025.01); *H10D 30/031* (2025.01); *H10D 30/6713* (2025.01); *H10D 84/013* (2025.01); *H10D 84/038* (2025.01)

(58) Field of Classification Search
CPC ......... H01L 29/42392; H01L 29/66742; H01L 29/78618; H01L 21/823418; H10D 30/6735; H10D 30/6713; H10D 30/031; H10D 84/013; H10D 84/038
USPC ......................................................... 257/288
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2009/0294864 A1* | 12/2009 | Suk | H10D 30/6735 257/E29.264 |
| 2014/0151639 A1* | 6/2014 | Chang | H10D 86/01 257/27 |

(Continued)

*Primary Examiner* — Eric W Jones
(74) *Attorney, Agent, or Firm* — Sterne, Kessler, Goldstein & Fox P.L.L.C.

(57) ABSTRACT

The present disclosure describes a semiconductor device having a buried gate structure. The semiconductor device includes a substrate and a fin structure on the substrate. The fin structure includes a top portion and a bottom portion. The semiconductor device further includes a gate structure on the bottom portion of the fin structure. Multiple semiconductor layers in the top portion of the fin structure are disposed on the gate structure. The semiconductor device further includes a source/drain structure above the gate structure and in contact with the multiple semiconductor layers.

20 Claims, 13 Drawing Sheets

(56) References Cited

U.S. PATENT DOCUMENTS

| | | | |
|---|---|---|---|
| 2015/0084041 A1* | 3/2015 | Hur | H10D 30/611 |
| | | | 257/43 |
| 2018/0090582 A1* | 3/2018 | Adusumilli | H01L 27/0924 |
| 2018/0122703 A1* | 5/2018 | Cheng | H01L 29/6681 |
| 2018/0301531 A1* | 10/2018 | Xie | H01L 21/02532 |
| 2019/0131415 A1* | 5/2019 | Cheng | H01L 29/78696 |
| 2020/0044087 A1* | 2/2020 | Guha | H01L 21/823821 |
| 2021/0050415 A1* | 2/2021 | Bhuwalka | H10D 30/014 |

\* cited by examiner

BURIED GATE STRUCTURES FOR SEMICONDUCTOR DEVICES

CROSS-REFERENCE TO RELATED APPLICATIONS

This application claims the benefit of U.S. Provisional Patent Application No. 63/168,346, titled "The Gate-All-Around Device with Buried-Gate Structure for Sub-Channel Leakage Reduction and Vt modulation by SD engineering," filed Mar. 31, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
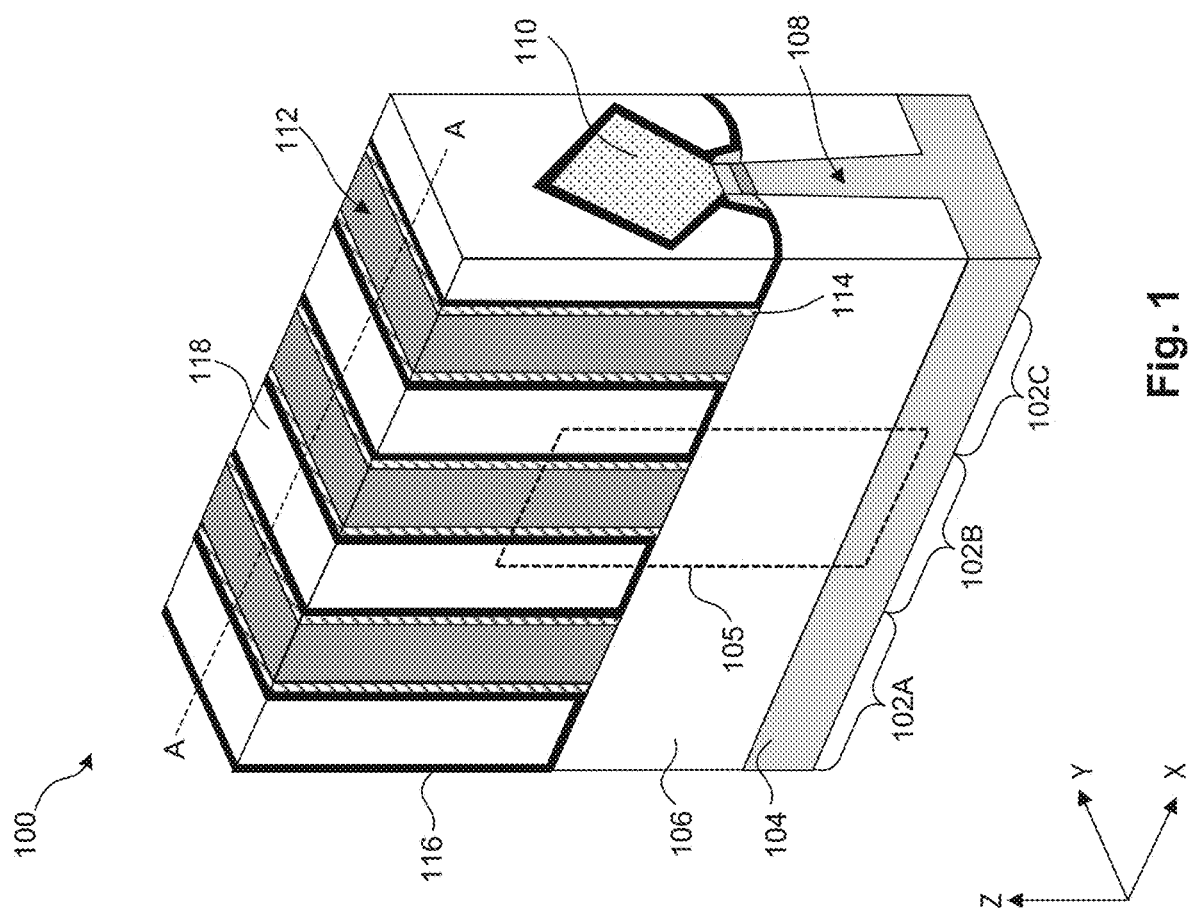
FIG. 1 illustrates an isometric view of a semiconductor device having buried gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, +10%, ±20% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, reducing off-state current, and reducing short-channel effects (SCEs). One such multi-gate device is the gate-all-around fin field effect transistor (GAA finFET), which provides a channel in a stacked nanosheet/nanowire configuration. The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, GAA finFET devices can have their challenges. For example, GAA finFET devices can have an off-state leakage current through substrate below the gate structure and the channel of GAA finFET devices. The off-state leakage current can be modulated by drain-induced barrier lowering (DIBL) of the GAA finFET devices and higher off-state leakage current can degrade the device performance of the GAA finFET devices.

Various embodiments in the present disclosure provide example methods for forming a buried gate structure in field effect transistors (FET) devices (e.g., finFETs, GAA FETs, and MOSFETs) and/or other semiconductor devices in an integrated circuit (IC). The example methods in the present disclosure can control a recess depth for source/drain (S/D) structures of the FET devices and form a buried gate structure below a bottom channel and S/D structures of the FET devices. The buried gate structure can reduce the off-state leakage current and tune a threshold voltage ($V_t$) of the FET devices. In some embodiments, more than one buried gate structure can be formed below the bottom channel and the S/D structures of the FET devices by controlling the recess depth for the S/D structures. In some embodiments, adjacent buried gate structures can be connected. In some embodiments, adjacent buried gate structures can be separated by a buried semiconductor layer. According to some embodiments, FET devices with the buried gate structure can reduce the DIBL by about 10 mV to about 20 mV and increase $V_t$ by about 30 mV to about 50 mV.

Figure 2:
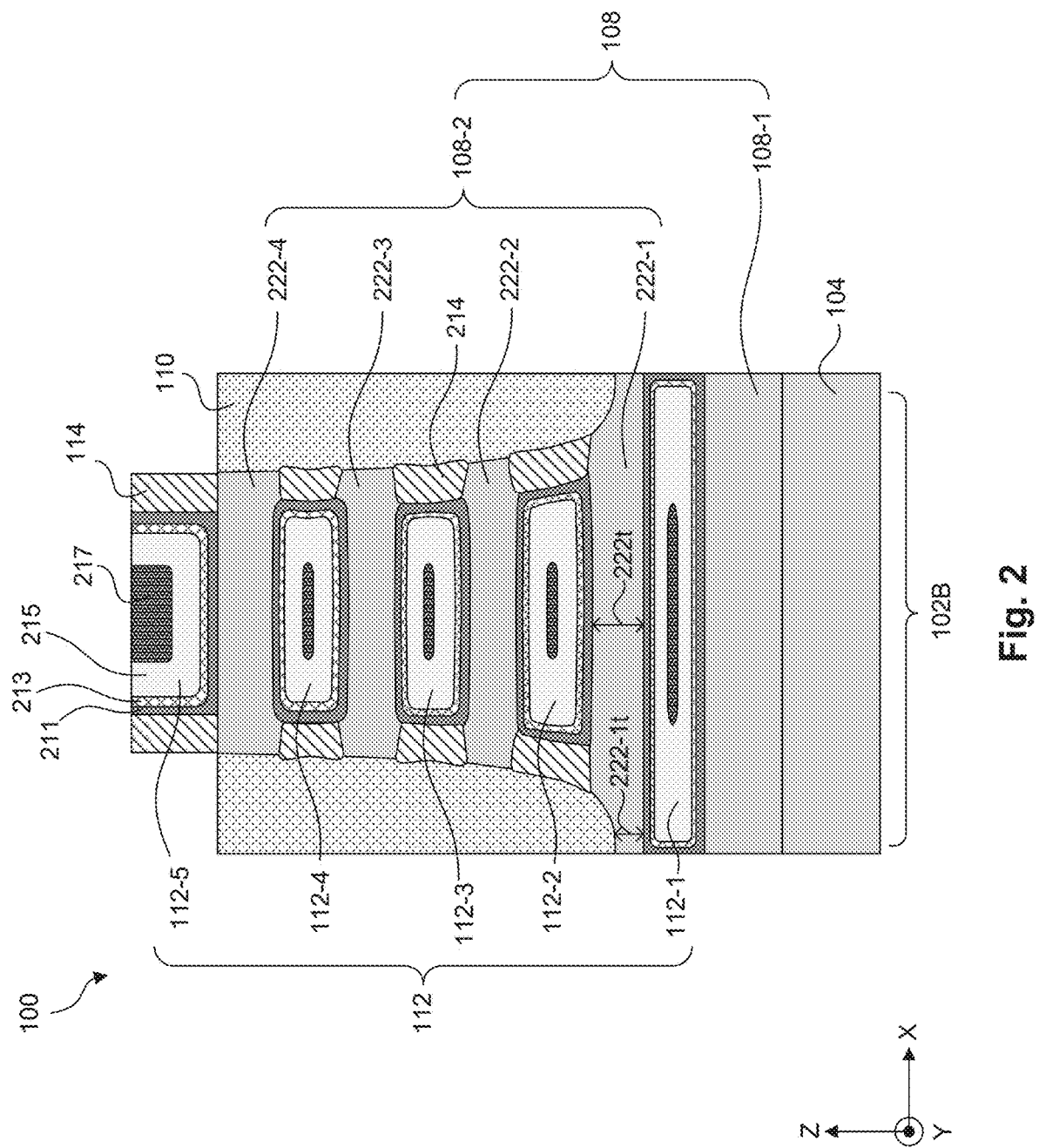
FIG. 2 illustrates a partial cross-sectional view of a semiconductor device having buried gate structures, in accordance with some embodiments.

FIG. 1 illustrates an isometric view of a semiconductor device 100 having a buried gate structure, in accordance with some embodiments. Semiconductor device 100 can have finFETs 102A-102C. FIG. 2 illustrates a zoomed-in cross-sectional view of area 105 along line A-A of semiconductor device 100 having buried gate structure 112-1, in accordance with some embodiments. Referring to FIGS. 1 and 2, semiconductor device 100 having finFETs 102A-102C can be formed on a substrate 104 and can include fin structures 108, shallow trench isolation (STI) regions 106, S/D structures 110, gate structures 112, gate spacers 114, etch stop layer (ESL) 116, and interlayer dielectric (ILD) layer 118.

In some embodiments, finFETs 102A-102C can be both n-type finFETs (NFETs). In some embodiments, finFET 102A can be an NFET and have n-type S/D structures 110. FinFET 102B can be a p-type finFET (PFET) and have p-type S/D structures 110. FinFET 102C can be an NFET and have n-type S/D structures 110. In some embodiments, finFETs 102A-102C can be both PFETs. Though FIGS. 1 and 2 show three finFETs, semiconductor device 100 can have any number of finFETs. In addition, semiconductor device 100 can be incorporated into an IC through the use of other structural components, such as contact structures, conductive vias, conductive lines, dielectric layers, passivation layers, and interconnects, which are not shown for simplicity. ESL 116 and ILD layer 118 are not shown in FIG. 2 for simplicity. The discussion of elements of finFETs 102A-102C with the same annotations applies to each other, unless mentioned otherwise. And like reference numerals generally indicate identical, functionally similar, and/or structurally similar elements.

Referring to FIGS. 1 and 2, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 can provide electrical isolation between finFET 102A-102C from each other and from neighboring finFETs (not shown) on substrate 104 and/or neighboring active and passive elements (not shown) integrated with or deposited on substrate 104. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Referring to FIGS. 1 and 2, fin structures 108 can be formed from patterned portions of substrate 104. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

As shown in FIGS. 1 and 2, fin structures 108 can extend along an X-axis and through finFETs 102A-102C. Fin structures 108 can include a fin bottom portion 108-1 on substrate 104 and a fin top portion 108-2 on fin bottom portion 108-1. In some embodiments, fin bottom portion 108-1 can include material similar to substrate 104. Fin bottom portion 108-1 can be formed from a photolithographic patterning and an etching of substrate 104. In some embodiments, fin top portion 108-2 can include a stack of semiconductor layers 222-1, 222-2, 222-3, and 222-4 (collectively referred to as "semiconductor layers 222"), which can be in the form of nanosheets or nanowires. Each of semiconductor layers 222 can form a channel region underlying gate structures 112 of finFETs 102A-102C. In some embodiments, semiconductor layers 222 can include semiconductor materials similar to or different from substrate 104. In some embodiments, each of semiconductor layers 222 can include silicon. In some embodiments, each of semiconductor layers 222 can include silicon germanium. The semiconductor materials of semiconductor layers 222 can be undoped or can be in-situ doped during their epitaxial growth process. Each of semiconductor layers 222 can have a vertical dimension $222t$ (e.g., thicknesses) along a Z-axis ranging from about 6 nm to about 15 nm. In FIGS. 1 and 2, fin structures 108 under gate structures 112 can form channel regions of semiconductor device 100 and represent current carrying structures of semiconductor device 100. Though four layers of semiconductor layers 222 are shown in FIG. 2, finFETs 102A-102C can have any number of semiconductor layers 222.

Referring to FIG. 2, bottom semiconductor layer 222-1 can be disposed between S/D structures 110 and buried gate structure 112-1. In some embodiments, a portion of bottom semiconductor layer 222-1 below S/D structures 110 can have a vertical dimension $222$-$1t$ (e.g., thicknesses) along a Z-axis ranging from about 3 nm to about 8 nm. Vertical dimension $222$-$1t$ can also illustrate a distance between S/D structures 110 and buried gate structure 112-1. A ratio of vertical dimension 222-1*t* to vertical dimension 222*t* can range from about 0.2 to about 0.8. If vertical dimension 222-1*t* is less than about 3 nm, or the ratio is less than about 0.2, S/D structures 110 and buried gate structures 112-1 may have an electrical short. If vertical dimension 222-1*t* is greater than about 8 nm, or the ratio is greater than about 0.8, a contact area between S/D structures 110 and bottom semiconductor layer 222-1 may be reduced and the on-state channel current may be reduced.

S/D structures 110 can be disposed on opposing sides of gate structures 112 and function as S/D regions of semiconductor device 100. Referring to FIGS. 1 and 2, S/D structures 110 can be disposed on bottom semiconductor layer 222-1 and in contact with semiconductor layers 222. In some embodiments, S/D structures 110 can have any geometric shape, such as a polygon, an ellipsis, and a circle. In some embodiments, S/D structures 110 can include an epitaxially-grown semiconductor material the same as the material of substrate 104. In some embodiments, the epitaxially-grown semiconductor material can include a material different from the material of substrate 104 and imparts a strain on the channel regions under gate structures 112. Since the lattice constant of such epitaxially-grown semiconductor material is different from the material of substrate 104, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 110 can include silicon and can be in-situ doped during an epitaxial growth process using n-type dopants, such as phosphorus and arsenic. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. In some embodiments, S/D structures 110 can include one or more epitaxial layers and each epitaxial layer can have different compositions.

Referring to FIGS. 1 and 2, gate structures 112-1, 112-2, 112-3, 112-4, and 112-5 (collectively referred to as "gate structures 112") can be multi-layered structures and can wrap around semiconductor layers 222 in fin top portion 108-2. In some embodiments, each of semiconductor layers 222 can be wrapped around by one of gate structures 112 or one or more layers of one of gate structures 112, in which gate structures 112 can be referred to as "gate-all-around (GAA) structures" and finFETs 102A, 102B, and 102C can also be referred to as "GAA FETs 102A-102C" or "GAA finFETs 102A-102C."

Each of gate structures 112 can include an interfacial layer 211, a high-k gate dielectric layer 213, a work-function layer 215, and a gate electrode 217. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, interfacial layer 211 can include silicon oxide. In some embodiments, high-k gate dielectric layer 213 can include hafnium oxide ($HfO_2$), zirconium oxide ($ZrO_2$), and other suitable high-k dielectric materials. As shown in FIG. 2, interfacial layer 211 and high-k gate dielectric layer 213 can wrap around each of semiconductor layers 222, and thus electrically isolate semiconductor layers 222 from each other and from conductive work-function layer 215 and gate electrode 217 to prevent shorting between gate structures 112 and semiconductor layers 222 during operation of finFETs 102A-102C.

Work-function layer 215 can wrap around semiconductor layers 222 and can include work-function metals to tune $V_t$ of finFETs 102A-102C. In some embodiments, work-function layer 215 can include titanium nitride, ruthenium, titanium aluminum, titanium aluminum carbon, tantalum aluminum, tantalum aluminum carbon, or other suitable work-function metals. In some embodiments, work-function layer 215 can include a single metal layer or a stack of metal layers. The stack of metal layers can include work-function metals having work-function values equal to or different from each other. Gate electrode 217 can include titanium, tantalum, aluminum, cobalt, tungsten, nickel, ruthenium, and other suitable conductive materials. Depending on the spaces between adjacent semiconductor layers 222 and the thicknesses of the layers of gate structures 112, semiconductor layers 222 can be wrapped around by one or more layers of the gate structures 112 filling the spaces between adjacent semiconductor layers 222.

Referring to FIG. 2, disposed below bottom semiconductor layer 222-1 and S/D structures 110, gate structure 112-1 can be referred to as "buried gate structure 112-1." In some embodiments, buried gate structure 112-1 can improve gate control of the channel current flowing through bottom semiconductor layer 222-1 and reduce the off-state leakage current in bottom semiconductor layer 222-1. With buried gate structure 112-1, S/D structures 110 can be in contact with semiconductor layers 222 but not in contact with fin bottom portion 108-1. As a result, off-state leakage current between adjacent S/D structures 110 does not flow through fin bottom portion 108-1 below buried gate structures 112-1. According to some embodiments, semiconductor device 100 with buried gate structure 112-1 can reduce the DIBL by about 10 mV to about 20 mV and increase Vt by about 30 mV to about 50 mV compared to a semiconductor device with no buried gate structures.

Referring to FIGS. 1 and 2, gate spacers 114 can be disposed on sidewalls of gate structures 112 and inner spacer structures 214 can be disposed between S/D structures 110 and gate structures 112, according to some embodiments. Gate spacers 114 and inner spacer structures 214 can include insulating materials, such as silicon oxide, silicon nitride, silicon oxynitride, silicon carbonitride, silicon oxycarbide, silicon oxycarbonitride, a low-k material, and a combination thereof. Gate spacers 114 and inner spacer structures 214 can include a single layer or a stack of insulating layers. Gate spacers 114 and inner spacer structures 214 can have a low-k material with a dielectric constant less than about 3.9 (e.g., about 3.5, about 3.0, or about 2.8).

ESL 116 can be disposed on STI regions 106, S/D structures 110, and sidewalls of gate spacers 114. ESL 116 can be configured to protect STI regions 106, S/D structures 110, and gate structures 112 during the formation of S/D contact structures on S/D structures 110. In some embodiments, ESL 116 can include, for example, silicon oxide, silicon nitride, silicon oxynitride, silicon carbide, silicon carbonitride, boron nitride, silicon boron nitride, silicon carbon boron nitride, or a combination thereof.

ILD layer 118 can be disposed on ESL 116 over S/D structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide.

Figure 3:
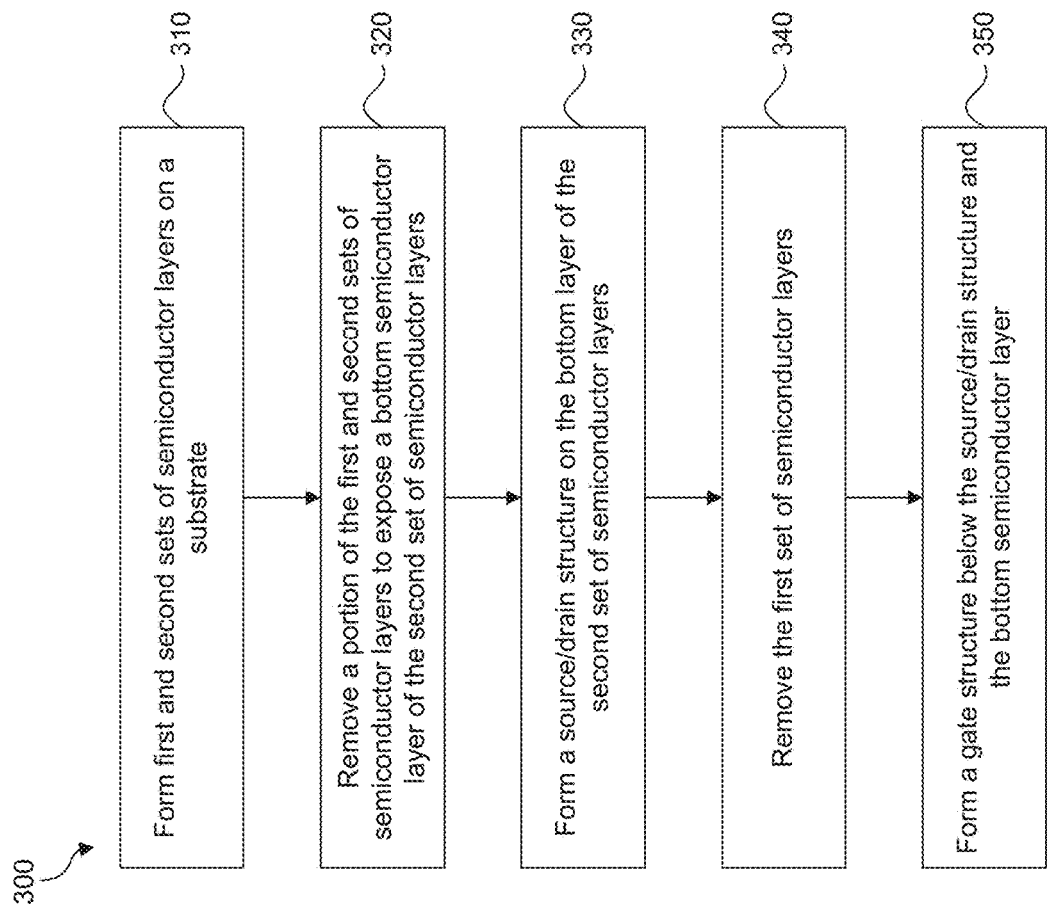
FIG. 3 is a flow diagram of a method for fabricating a semiconductor device having buried gate structures, in accordance with some embodiments.

FIG. 3 is a flow diagram of a method 300 for fabricating semiconductor device 100 having buried gate structure 112-1, in accordance with some embodiments. Method 300 may not be limited to finFET devices and can be applicable to devices that would benefit from buried gate structures, such as planar FETs, finFETs, GAA FETs, and other semiconductor devices. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for fabricating semiconductor device 100 as illustrated in FIGS. 4-8. FIGS. 4-8 illustrate partial cross-sectional views of semiconductor device 100 having buried gate structures 112-1 at various stages of its fabrication, in accordance with some embodiments. Elements in FIGS. 4-8 with the same annotations as elements in FIGS. 1 and 2 are described above.

Figure 4:
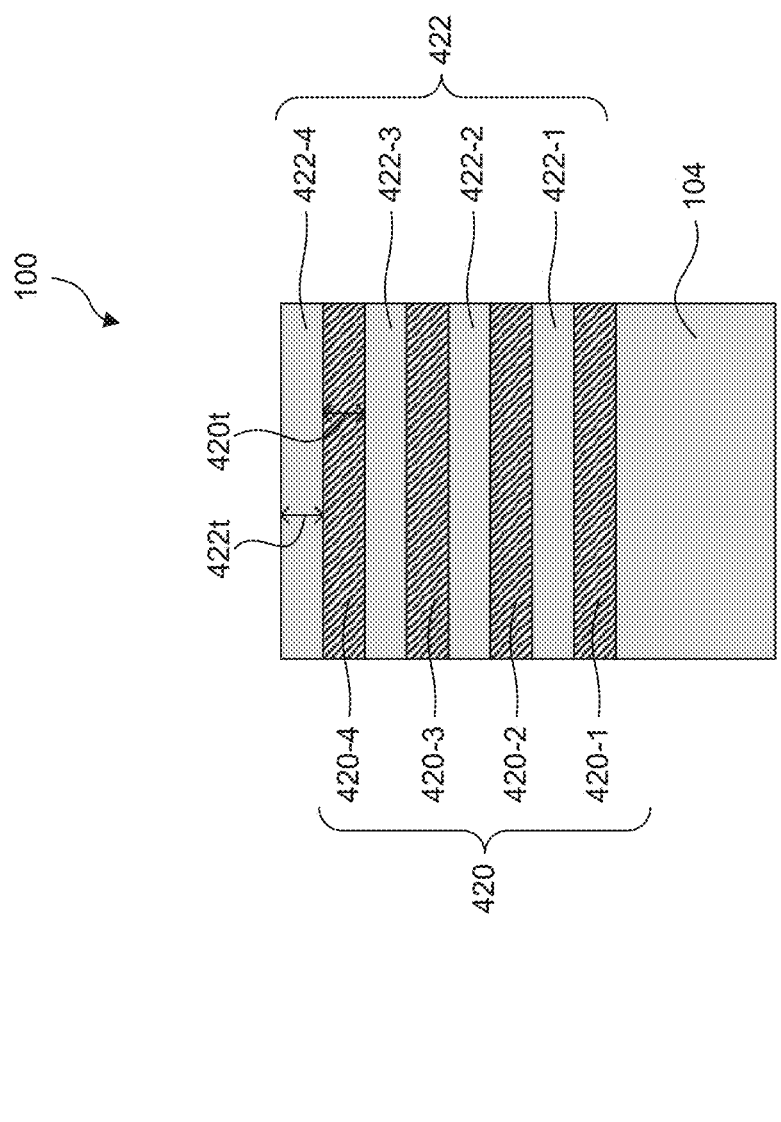
FIGS. 4-8 illustrate cross-sectional views of a semiconductor device having buried gate structures at various stages of its fabrication, in accordance with some embodiments.

In referring to FIG. 3, method 300 begins with operation 310 and the process of forming first and second semiconductor layers on a substrate. For example, as shown in FIG. 4, first set of semiconductor layers 420-1, 420-2. 420-3, and 420-4 (collectively referred to as "semiconductor layers 420") and second set of semiconductor layers 422-1, 422-2. 422-3, and 422-4 (collectively referred to as "semiconductor layers 422") can be formed on substrate 104. First and second sets of semiconductor layers 420 and 422 can be stacked in an alternating configuration. In some embodiments, first and second semiconductor layers 420 and 422 can be epitaxially grown on substrate 104. In some embodiments, first set of semiconductor layers 420 can include a semiconductor material different from substrate 104. Second set of semiconductor layers 422 can include a semiconductor material same as substrate 104. In some embodiments, substrate 104 and second set of semiconductor layers 422 can include silicon. First set of semiconductor layers 420 can include silicon germanium. In some embodiments, substrate 104 and second set of semiconductor layers 422 can include silicon germanium. First set of semiconductor layers 420 can include silicon. In some embodiments, a germanium concentration in the silicon germanium can range from about 20% to about 50%.

In some embodiments, first set of semiconductor layers 420 can have a vertical dimension 420$t$ (e.g., thickness) along a Z-axis ranging from about 3 nm to about 10 nm. If vertical dimension 420$t$ is less than about 3 nm, work-function materials of gate structures 112 may not fill between second set of semiconductor layers 422 in subsequent processes. If vertical dimension 420$t$ is greater than about 10 nm, second set of semiconductor layers 422 may have smaller dimensions and the on-state current of semiconductor device 100 may decrease. Second set of semiconductor layers 422 can have a vertical dimension 422$t$ (e.g., thickness) along a Z-axis ranging from about 6 nm to about 15 nm. If vertical dimension 422$t$ is less than about 6 nm, the on-state current of semiconductor device 100 may decrease. If vertical dimension 422$t$ is greater than about 15 nm, first set of semiconductor layers 420 may have smaller dimensions and work-function materials of gate structures 112 may not fill between second set of semiconductor layers 422.

Figure 5:
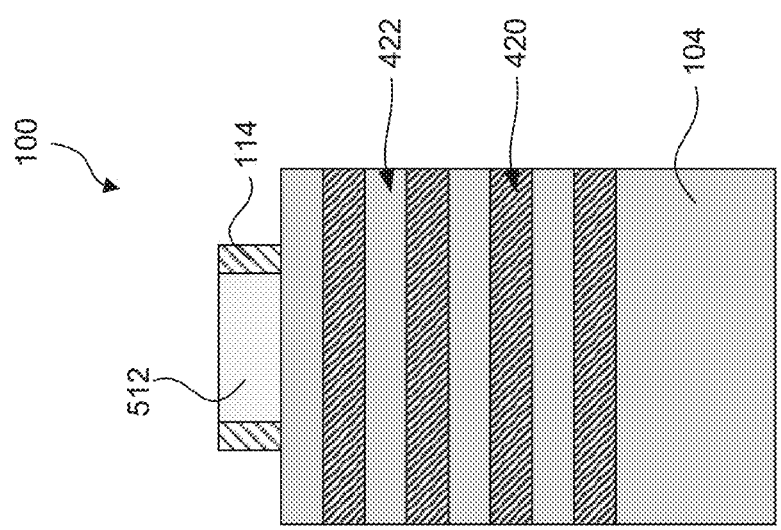
Figure 6:
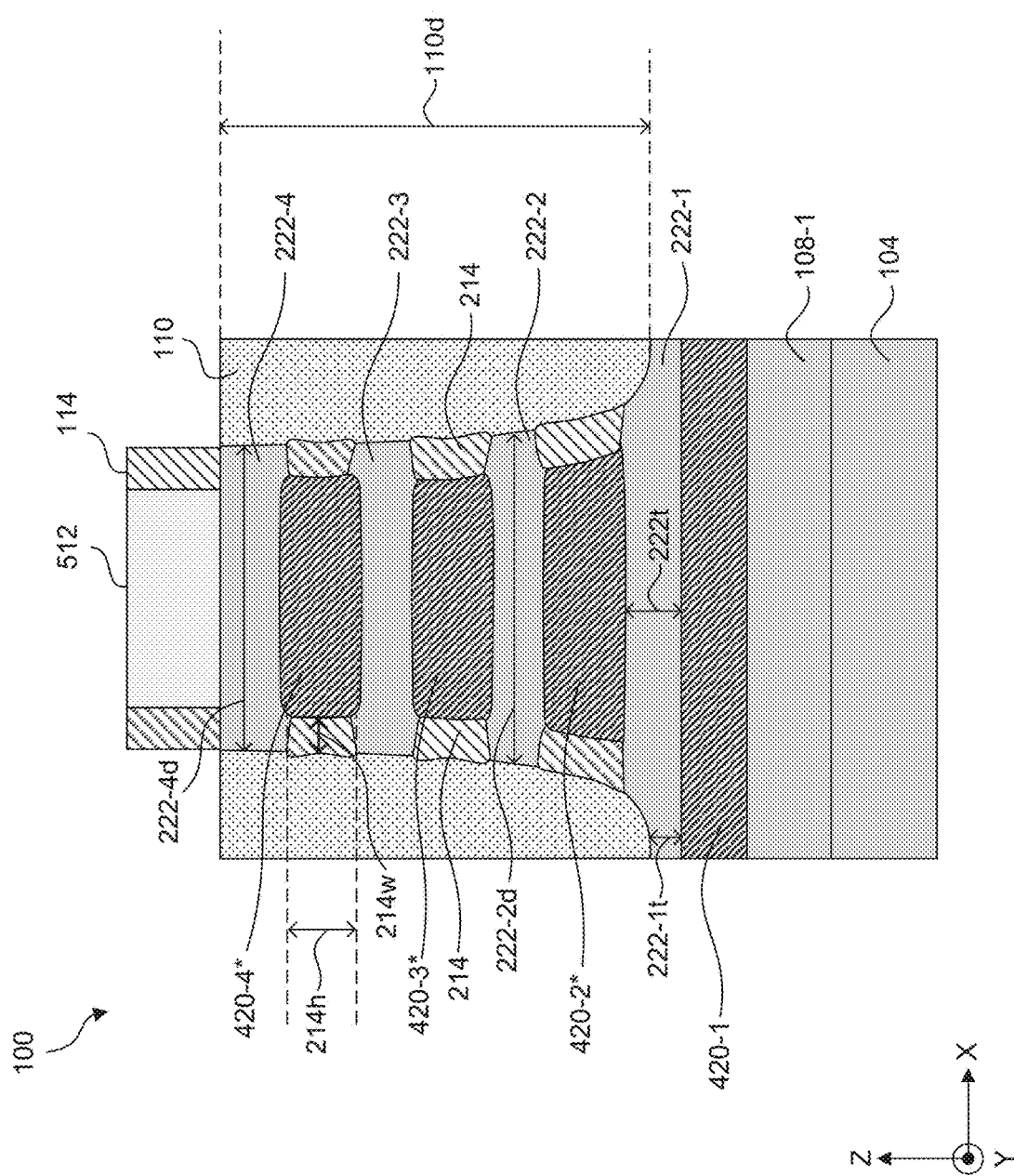

Referring to FIG. 3, in operation 320, a portion of the first and second sets of semiconductor layers are removed to expose a bottom semiconductor layer of the second set of semiconductor layers. For example, as shown in FIGS. 5 and 6, a portion of first and second set of semiconductor layers 420 and 422 can be removed to expose bottom semiconductor layer 422-1 (also referred to as "bottom semiconductor layer 222-1") of second set of semiconductor layers 420. The removal of the portion of first and second set of semiconductor layers 420 and 422 can include formation of patterned dummy gate structures 512, formation of gate spacers 114, and modulated S/D regions recess.

Referring to FIG. 5, in some embodiments, dummy gate structures 512 can be formed by a blanket deposition of amorphous silicon or polysilicon followed by photolithography and etching of the deposited amorphous silicon or polysilicon. In some embodiments, gate spacers 114 can be formed by a blanket deposition of a dielectric material followed by a directional etch to keep the dielectric material on sidewall surfaces of dummy gate structures 512. In some embodiments, the dielectric material can include silicon oxide, silicon nitride, silicon oxynitride, silicon carbonitride, silicon oxycarbide, silicon oxycarbonitride, a low-k material, and a combination thereof.

In some embodiments, the modulated S/D regions recess can include a dry etch process performed at a temperature from about 40° C. to about 70° C. The dry etch process can be biased at a voltage from about 300 V to about 600 V. The dry etch process can include etchants such as trifluoromethane ($CHF_3$), difluoromethane ($CH_2F_2$), fluoromethane ($CH_3F$), hydrofluoride (HCl), and hydroxylamine (HBr). The etchants can be carried by carrier gases, such as argon (Ar) and helium (He). In some embodiments, the dry etch process can remove a portion of the first and second sets of semiconductor layers 420 and 422 and can stop on bottom semiconductor layer 222-1, as shown in FIG. 6. In some embodiments, a recess depth 110$d$ along a Z-axis can range from about 45 nm to about 55 nm.

In some embodiments, the dry etch process can form a sloped sidewall as shown in FIG. 6. Semiconductor layer 222-4 can have a length 222-4$d$ along an X-axis ranging from about 15 nm to about 30 nm. Semiconductor layer 222-2 can have a length 222-2$d$ along an X-axis ranging from about 20 nm to about 35 nm. A difference between length 222-4$d$ and length 222-2$d$ can range from about 3 nm to about 8 nm. Referring to FIG. 6, each of semiconductor layers 222 can have vertical dimension 222$t$ along a Z-axis between semiconductor layers 420 ranging from about 6 nm to about 15 nm. Bottom semiconductor layer 222-1 can have vertical dimension 222-1$t$ along a Z-axis ranging from about 3 nm to about 8 nm to prevent an electrical short between subsequently-formed S/D structures 110 and gate structures 112. In some embodiments, a ratio between vertical dimension 222-1$t$ to vertical dimension 222$t$ can range from about 0.2 to about 0.8.

The modulated S/D region recess can be followed by the formation of inner spacer structures 214. As shown in FIG. 6, first set of semiconductor layers 420 can be laterally recessed through the S/D regions recess. A dielectric material can be blanket deposited to fill the lateral recess. An etch process can partially remove the deposited dielectric material from exposed surfaces and keep the deposited dielectric material in the lateral recess between semiconductor layers 222. In some embodiments, inner spacer structures 214 can have a width 214w along an X-axis ranging from about 2 nm to about 8 nm. In some embodiments, inner spacer structures 214 can have a height 214h along a Z-axis ranging from about 3 nm to about 10 nm.

The formation of inner spacer structures 214 can be followed by the formation of S/D structures 110. In operation 330, S/D structures 110 can be epitaxially grown by (i) chemical vapor deposition (CVD), such as low pressure CVD (LPCVD), atomic layer CVD (ALCVD), ultrahigh vacuum CVD (UHVCVD), reduced pressure CVD (RPCVD), and any suitable CVD; (ii) molecular beam epitaxy (MBE) processes; (iii) any suitable epitaxial process; or (iv) a combination thereof. In some embodiments, S/D structures 110 can be grown by an epitaxial deposition/partial etch process, which repeats the epitaxial deposition/partial etch process at least once. Such repeated deposition/partial etch process can be referred to as a cyclic deposition-etch (CDE) process. The CDE process can reduce epitaxial defects formed during the growth and can control the profiles of S/D structures 110. In some embodiments, S/D structures 110 can include multiple epitaxial layers and can be in-situ doped with n-type or p-type dopants during the epitaxial growth process. In some embodiments, S/D structures 110 can have depth 110d along a Z-axis can range from about 45 nm to about 55 nm.

In some embodiments, S/D structures 110 can include silicon and can be in-situ doped during an epitaxial growth process using n-type dopants, such as phosphorus and arsenic. For n-type in-situ doping, n-type doping precursors, such as phosphine, arsine, and other n-type doping precursors, can be used. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. For p-type in-situ doping, p-type doping precursors, such as diborane, boron trifluoride, and other p-type doping precursors, can be used. In some embodiments, each of the multiple epitaxial layers of S/D structures 110 can have different compositions, for example, different dopant concentrations and/or different germanium concentrations.

The formation of S/D structures 110 can be followed by the formation of ESL 116 and the formation of ILD layer 118 on ESL 116. As shown in FIG. 1, ESL 116 can be formed on STI regions 106, S/D structures 110, and sidewalls of gate spacers 114 to protect STI regions 106, S/D structures 110, and gate structures 112 during the formation of S/D contact structures on S/D structures 110. ILD layer 118 can be formed on ESL 116 over S/D structures 110 and STI regions 106 to isolate adjacent structures, such as adjacent S/D structures 110.

Figure 7:
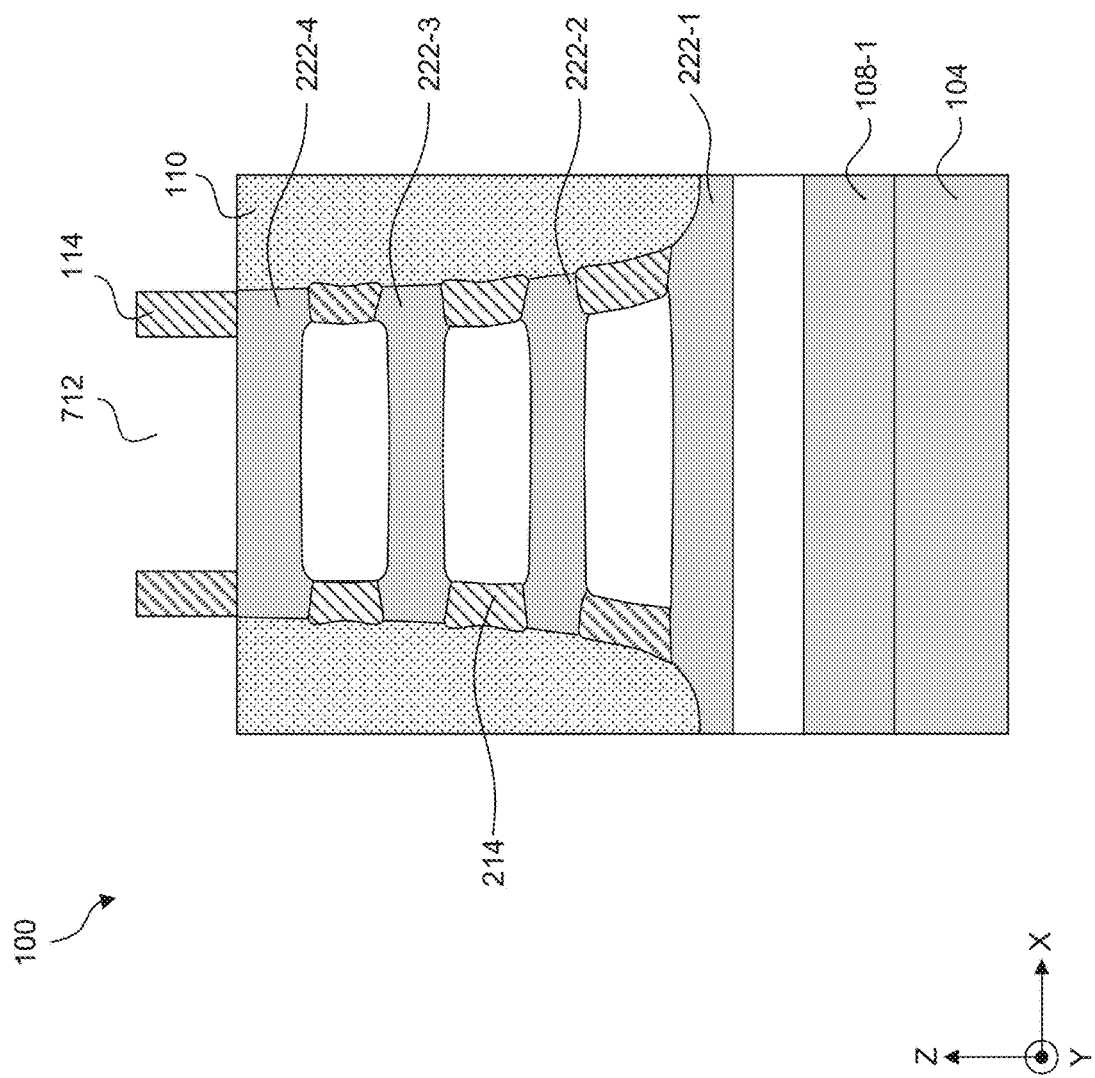

Referring to FIG. 3, in operation 340, the first set of semiconductor layers are removed. For example, as shown in FIGS. 6 and 7, first set of semiconductor layers 420 can be removed. In some embodiments, dummy gate structures 512 can be removed prior to the removal of first set of semiconductor layers 420. Dummy gate structures 512 and first set of semiconductor layers 420 can be removed in one or more etch processes. In some embodiments, the etch processes can include a dry etch process, a wet etch process, or other suitable etch processes. In some embodiments, the etch processes can be selective etch processes. Dummy gate structures 512 and first set of semiconductor layers 420 can have a higher etch selectivity than second set of semiconductor layers 422, gate spacers 114, and inner spacer structures 214. In some embodiments, the etch process can include a wet etch process performed at a temperature from about 10° C. to about 70° C. The wet etch process can include etchants, such as hydrogen fluoride acid (HF), deionized water/ozone solution ($DIO_3$), potassium hydroxide (KOH), ammonium hydroxide (NH4OH), and tetramethylammonium hydroxide (TMAH). As shown in FIG. 7, after the removal of first set of semiconductor layers 420, openings 712 can be formed between semiconductor layers 222 and below bottom semiconductor layer 222-1.

Figure 8:
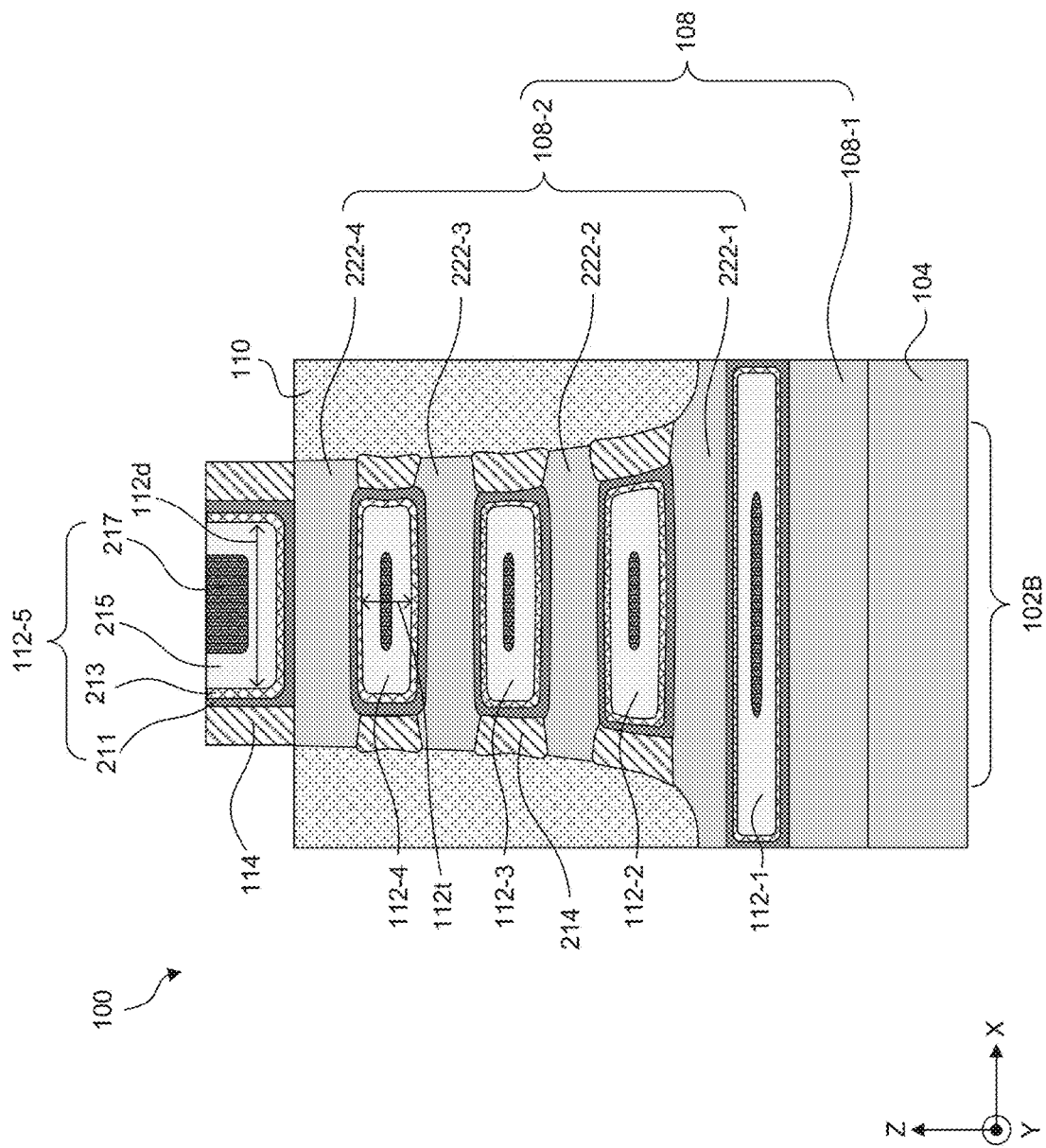

Referring to FIG. 3, in operation 350, a gate structure can be formed below the S/D structure and the bottom semiconductor layer. For example, as shown in FIG. 8, buried gate structure 112-1 can be formed below S/D structures 110 and bottom semiconductor layer 222-1. In some embodiments, buried gate structure 112-1 can be formed together with gate structures 112-2, 112-3, 112-4, and 112-5. Gate structures 112-2, 112-3, 112-4, and 112-5 can wrap around semiconductor layers 222 and can control the channel current flowing through semiconductor layers 222. In some embodiments, the formation of buried gate structure 112-1 together with gate structures 112-2, 112-3, 112-4, and 112-5 can include the formation of interfacial layer 211, the formation of high-k gate dielectric layer 213, the formation of work-function layer 215, and the formation of gate electrode 217. Interfacial layer 211 and high-k gate dielectric layer 213 can wrap around each of semiconductor layers 222. Depending on the spaces between adjacent semiconductor layers 222, one or more layers of work-function layer 215 and gate electrode 217 can fill between the spaces between adjacent semiconductor layers 222. In some embodiments, gate structures 112 can have a length 112d along an X-axis ranging from about 5 nm to about 20 nm. In some embodiments, gate structures 112 can have a thickness 112t between adjacent semiconductor layers 222 along a Z-axis ranging from about 3 nm to about 10 nm.

According to some embodiments, buried gate structure 112-1 can be formed below bottom semiconductor layer 222-1 and S/D structures 110 to control the channel current flowing through bottom semiconductor layer 222-1. Bottom semiconductor layer 222-1 can electrically isolate S/D structures 110 and buried gate structure 112-1. With buried gate structure 112-1, semiconductor device 100 can improve control of the channel current flowing through bottom semiconductor layer 222-1 and reduce the off-state leakage current in bottom semiconductor layer 222-1. In addition, S/D structures 110 can be in contact with semiconductor layers 222 but not in contact with fin bottom portion 108-1. As a result, off-state leakage current between adjacent S/D structures 110 does not flow through fin bottom portion 108-1 below buried gate structures 112-1. In addition, as bottom semiconductor layer 222-1 can have a smaller contact area with S/D structures 110 compared to semiconductor layers 222-2, 222-3, and 222-4, semiconductor device 100 can have a smaller channel current. As a result, the Vt of semiconductor device 100 can increase. According to some embodiments, semiconductor device 100 with buried gate structure 112-1 can reduce the DIBL by about 10 mV to about 20 mV and increase the Vt by about 30 mV to about 50 mV compared to a semiconductor device with no buried gate structures.

Figure 9:
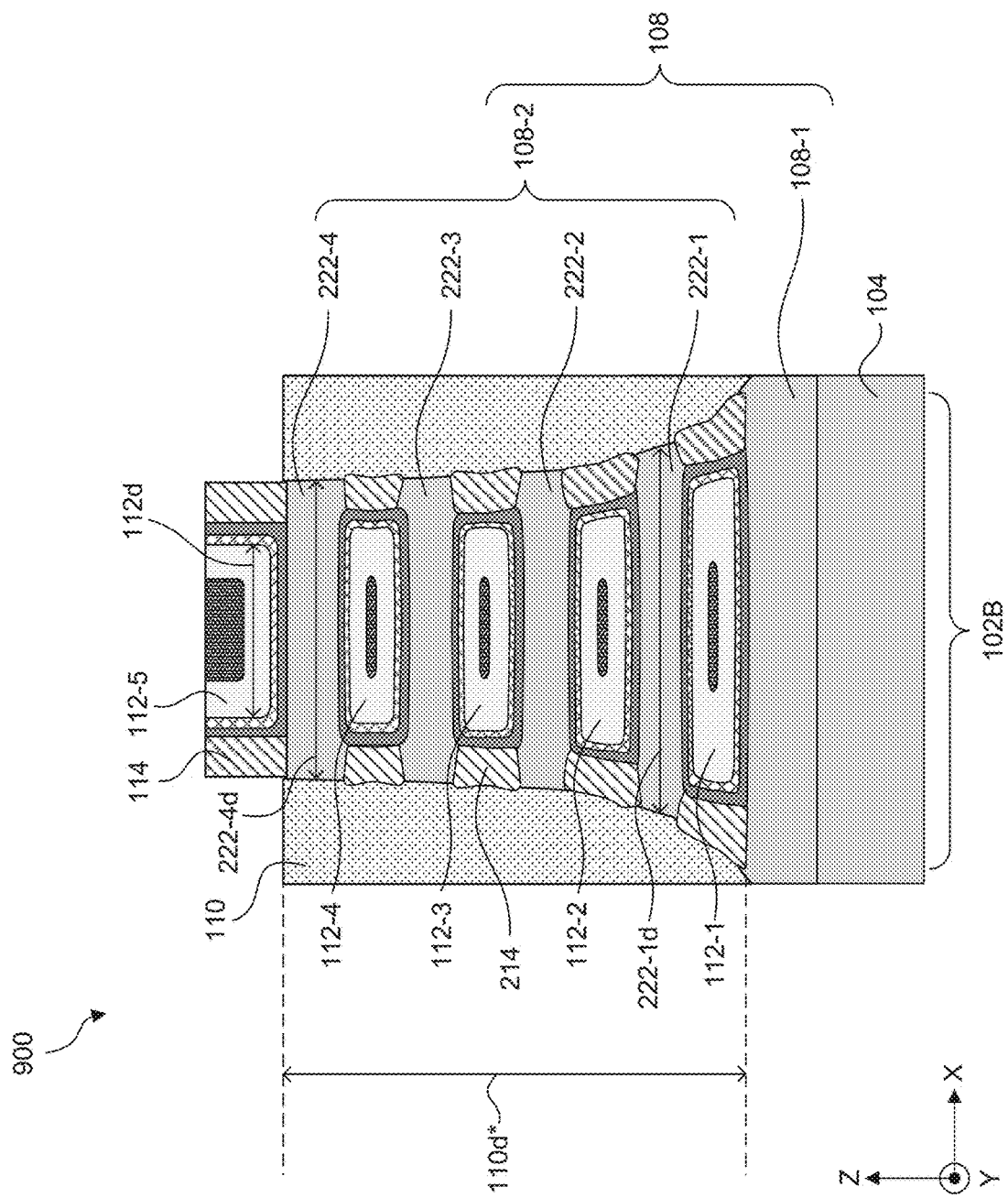
FIGS. 9-13 illustrate cross-sectional views of additional semiconductor devices having buried gate structures, in accordance with some embodiments.

In some embodiments, a portion of bottom semiconductor layers 420-1 can be removed during the modulated S/D regions recess and semiconductor device 900 can be formed as shown in FIG. 9. In some embodiments, S/D structures 110 can have a depth 110$d^*$ along a Z-axis ranging from about 55 nm to about 70 nm. In some embodiments, gate structures 112-1, 112-2, 112-3, and 112-4 can wrap around semiconductor layers 222 and a sub-channel can be formed below gate structure 112-1. An off-state leakage current can flow through the sub-channel under gate structure 112-1 between adjacent S/D structures 110. As gate structure 112-1 may be formed on top of the sub-channel but not wrapped around the sub-channel, gate structure 112-1 may have poor control of the sub-channel and the off-state leakage current of semiconductor device 900 can be higher than the off-state leakage current of semiconductor device 100 with buried gate structure 112-1. In some embodiments, semiconductor device 900 with no buried gate structure can have a DIBL of about 10 mV to about 20 mV higher and a $V_t$ about 30 mV to about 50 mV lower than semiconductor device 100 with buried gate structure 112-1.

In some embodiments, S/D structures 110 in semiconductor device 900 can have a sloped sidewall as shown in FIG. 9. Semiconductor layer 222-4 can have a length 222-4$d$ along an X-axis ranging from about 15 nm to about 30 nm and semiconductor layer 222-1 can have a length 222-$id$ along an X-axis ranging from about 23 nm to about 38 nm. A difference between length 222-4$d$ and length 222-1$d$ can range from about 5 nm to about 10 nm.

Figure 10:
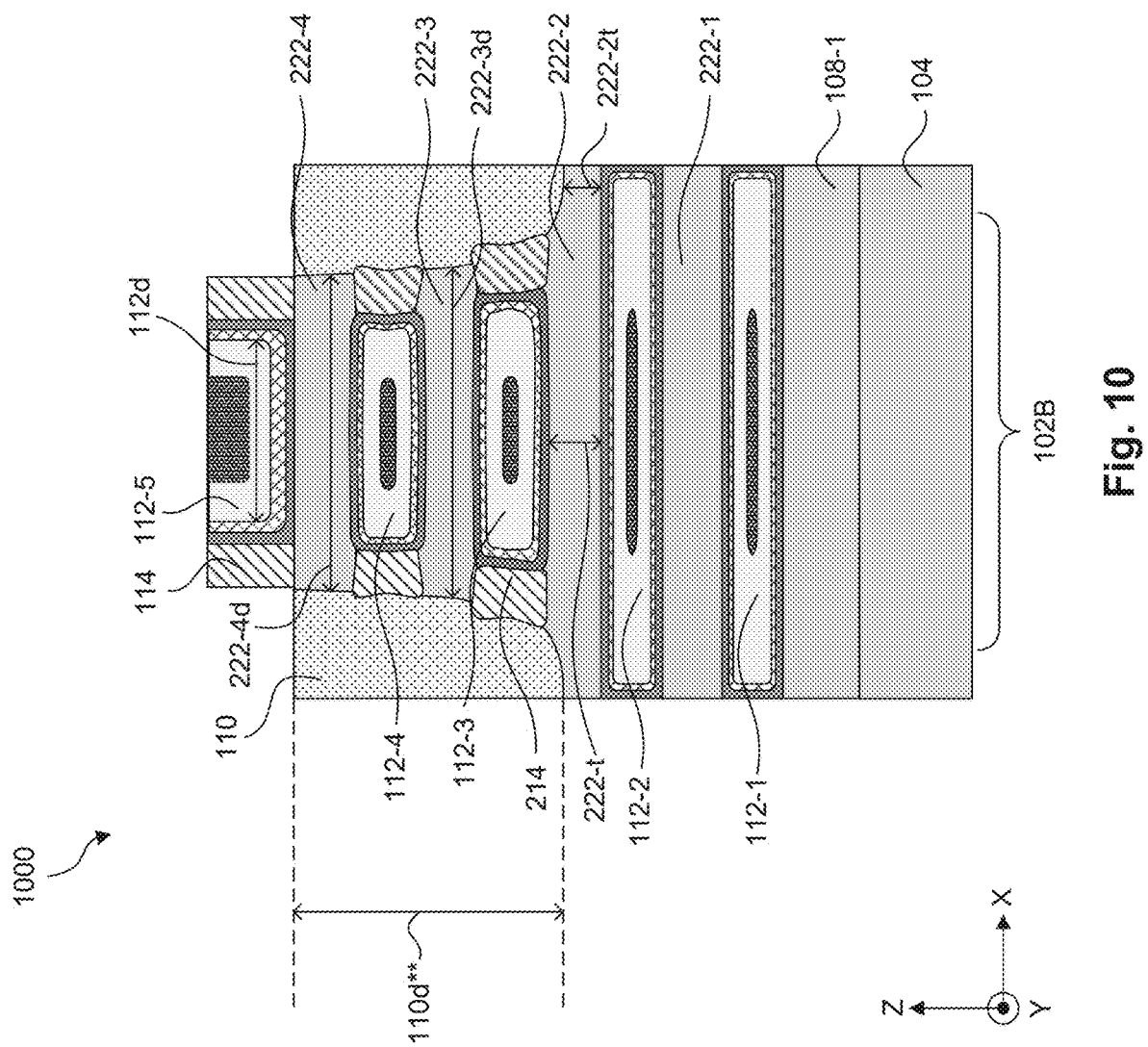

In some embodiments, semiconductor layers 420-1 and 420-2 may not be removed during the modulated S/D regions recess and semiconductor device 1000 can be formed as shown in FIG. 10. Buried gate structures 112-1 and 112-2 can be formed below S/D structures 110 and semiconductor layers 222-1 and 222-2. In some embodiments, S/D structures 110 can have a depth 110$d^{**}$ along a Z-axis ranging from about 35 nm to about 45 nm. Buried gate structures 112-1 and 112-2 can control the channel current flowing through semiconductor layer 222-2. Semiconductor layer 222-2 can electrically isolate S/D structures 110 and buried gate structures 112-1 and 112-2. With buried gate structures 112-1 and 112-2, semiconductor device 1000 can improve control of the channel current flowing through semiconductor layer 222-2 and reduce the off-state leakage current in semiconductor layer 222-2. In addition, S/D structures 110 can be in contact with semiconductor layers 222-2, 222-3 and 222-4 but not in contact with semiconductor layer 222-1. As a result, off-state leakage current between adjacent S/D structures 110 does not flow through semiconductor layer 222-1. According to some embodiments, semiconductor device 1000 with buried gate structures 112-1 and 112-2 can reduce the DIBL by about 20 mV to about 40 mV and can increase the $V_t$ by about 60 mV to about 100 mV compared to semiconductor device 900 with no buried gate structures.

In some embodiments, S/D structures 110 in semiconductor device 1000 can have a sloped sidewall as shown in FIG. 10. Semiconductor layer 222-4 can have a length 222-4$d$ along an X-axis ranging from about 15 nm to about 30 nm and semiconductor layer 222-3 can have a length 222-3$d$ along an X-axis ranging from about 17 nm to about 32 nm. A difference between length 222-4$d$ and length 222-3$d$ can range from about 1 nm to about 3 nm. Referring to FIG. 10, semiconductor layer 222-2 can have vertical dimension 222-2$t$ between S/D structures 110 and buried gate structure 112-2 along a Z-axis ranging from about 3 nm to about 8 nm to prevent an electrical short between S/D structures 110 and buried gate structure 112-2.

In some embodiments, an IC can include semiconductor device 900 with no buried gate structures, semiconductor device 100 with one buried gate structure 112-1, semiconductor device 1000 with two buried gate structures 112-1 and 112-2, and other semiconductor devices with more buried gate structures. Semiconductor device 900 can be a device formed with a first mask having no buried gate structures. Semiconductor device 100 can be a high $V_t$ device formed with a second mask having one buried gate structure 112-1. Semiconductor device 1000 can be an ultra-high $V_t$ device formed with a third mask having two buried gate structures 112-1 and 112-2. In some embodiments, the IC can include other semiconductor devices with more buried gate structures to further reduce the off-state leakage current and increase the $V_t$.

In some embodiments, the IC can include n-type semiconductor devices having devices with no buried gate structures, high $V_t$ devices with one buried gate structure, and ultra-high $V_t$ devices with two buried gate structures. In some embodiments, for n-type semiconductor devices, semiconductor layers 222 can include silicon and S/D structures 110 can include phosphorus doped silicon. In some embodiments, for n-type semiconductor devices, semiconductor layers 222 can include silicon germanium and S/D structures 110 can include phosphorus doped silicon germanium.

In some embodiments, the IC can include p-type semiconductor devices having devices with no buried gate structures, high Vt devices with one buried gate structure, and ultra-high Vt devices with two buried gate structures. In some embodiments, for p-type semiconductor devices, semiconductor layers 222 can include silicon and S/D structures 110 can include boron doped silicon. In some embodiments, for p-type semiconductor devices, semiconductor layers 222 can include silicon germanium and S/D structures 110 can include boron doped silicon germanium.

Figure 11:
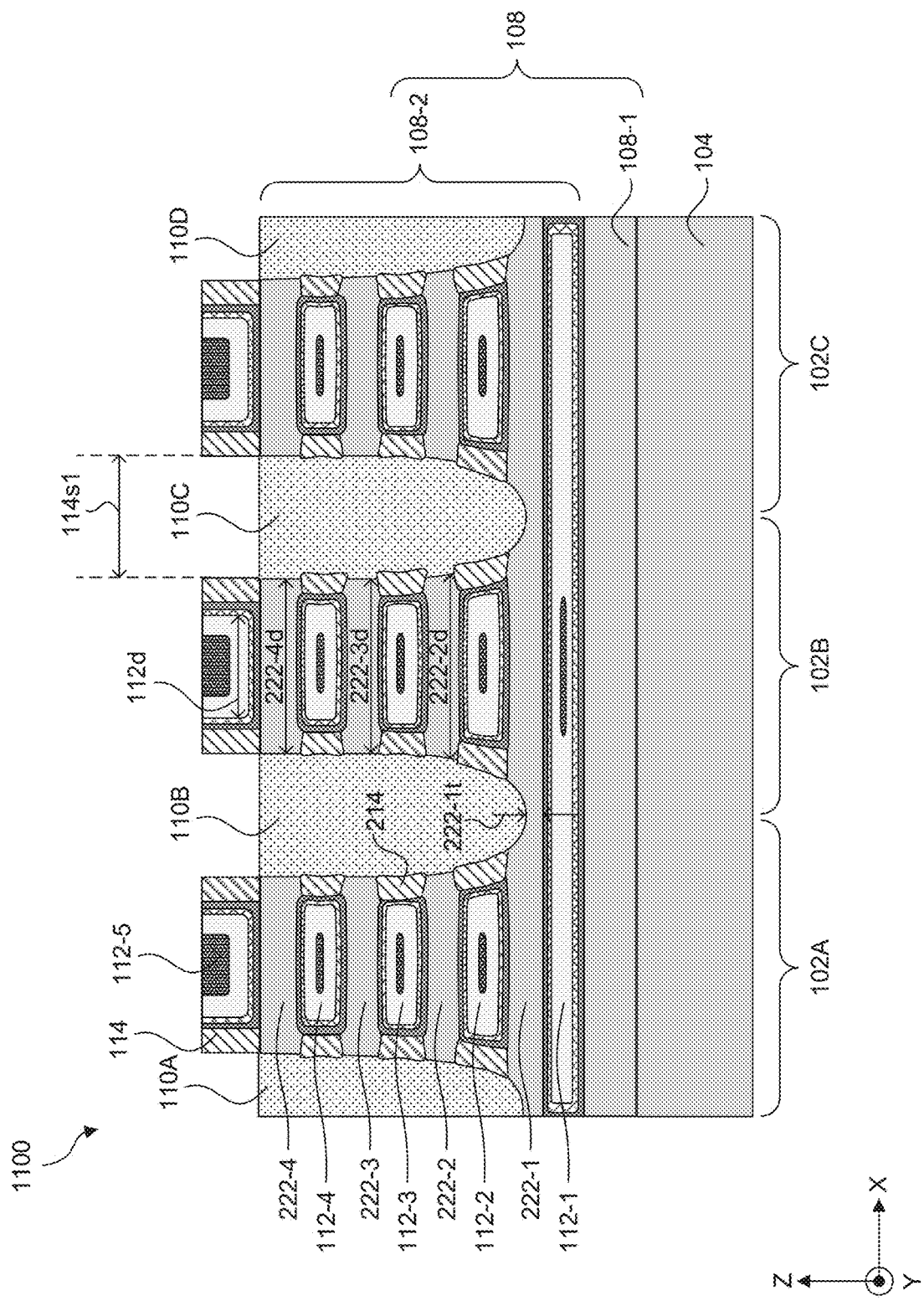

In some embodiments, for short channel finFETs with adjacent gate spacers 114 having a spacing 114$s$1 from about 20 nm to about 40 nm, buried gate structure 112-1 of adjacent finFETs can connect. For example, as shown in FIG. 11, semiconductor device 1100 with more than one finFET can be formed having a common buried gate structure 112-1. FIG. 11 can illustrate a cross-sectional view along line A-A in FIG. 1, in accordance with some embodiments. Buried gate structure 112-1 can be formed below semiconductor layer 222-1 and S/D structures 110A-110D. Buried gate structure 112-1 can control the channel current flowing through semiconductor layer 222-1. Semiconductor layer 222-1 can electrically isolate S/D structures 110A-110D and buried gate structure 112-1. In some embodiments, a portion of bottom semiconductor layer 222-1 between S/D structures 110 and buried gate structure 112-1 can have vertical dimension 222-1$t$ (e.g., thicknesses) along a Z-axis ranging from about 3 nm to about 8 nm. With buried gate structure 112-1, semiconductor device 1100 can improve control of the channel current flowing through semiconductor layer 222-1 and reduce the off-state leakage current in semiconductor layer 222-1.

Referring to FIG. 11, gate structures 112 of semiconductor device 1100 can have length 112$d$ along an X-axis ranging from about 5 nm to about 20 nm. Semiconductor layer 222-4 of each finFET in semiconductor device 1100 can have length 222-4$d$ along an X-axis ranging from about 15 nm to about 30 nm. Semiconductor layers 222-3 of each finFET in semiconductor device 1100 can have length 222-3$d$ along an X-axis ranging from about 17 nm to about 32 nm. Semiconductor layers 222-2 of each finFET in semiconductor device 1100 can have length 222-2$d$ along an X-axis ranging from about 20 nm to about 35 nm.

Figure 12:
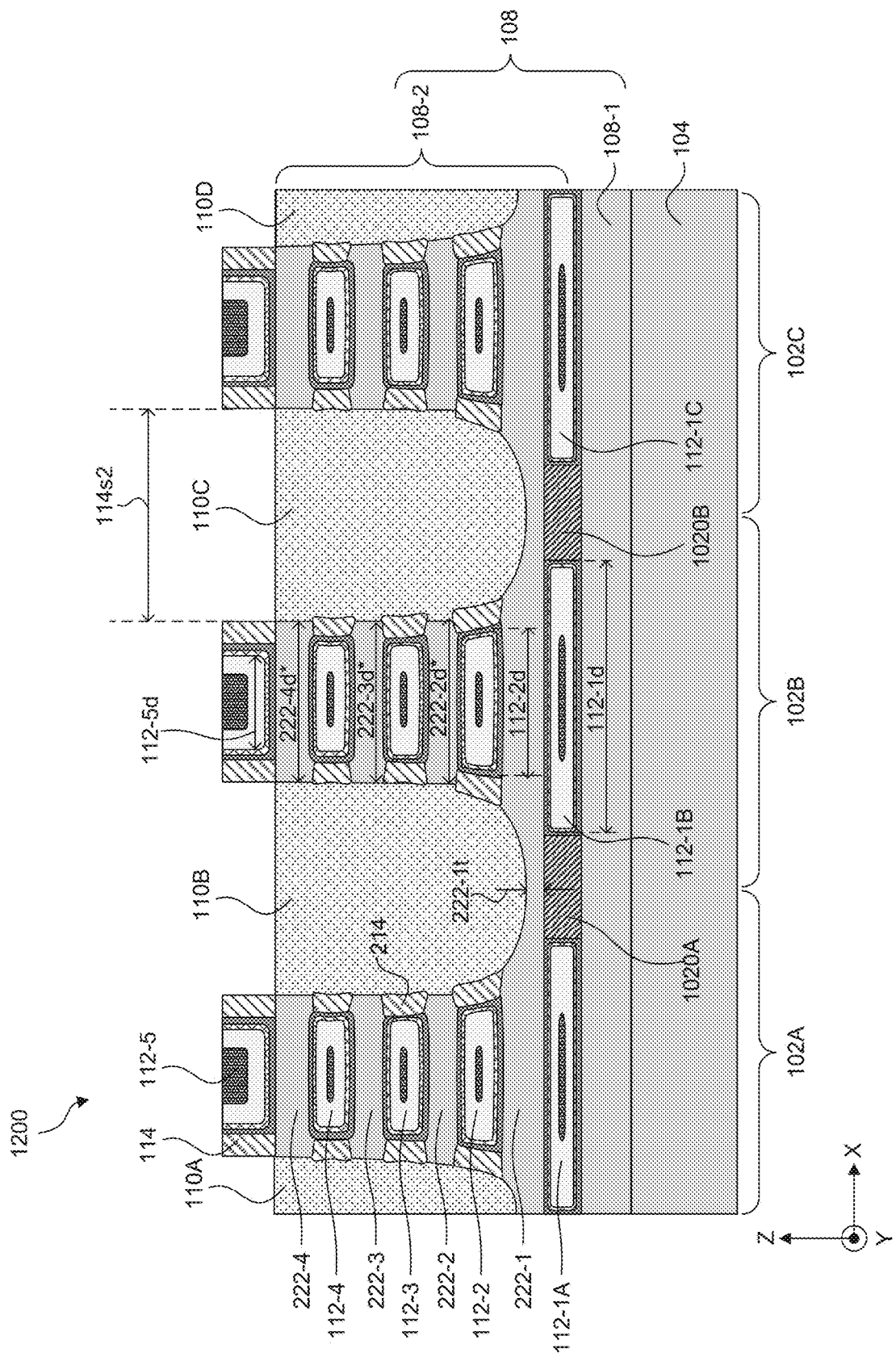

In some embodiments, for long channel finFETs with adjacent gate spacers 114 having a spacing 114s2 from about 50 nm to about 100 nm, buried gate structures of adjacent finFETs can be separated by buried semiconductor layers. For example, as shown in FIG. 12, semiconductor device 1200 with more than one finFET can be formed having buried gate structures 112-1A, 112-1B, and 112-4C. FIG. 12 can illustrate a cross-sectional view along line A-A in FIG. 1, in accordance with some embodiments. As shown in FIG. 12, buried gate structures 112-1A, 112-1B, and 112-1C can be formed below semiconductor layer 222-1 and S/D structures 110A-110D. Semiconductor layer 222-1 can electrically isolate S/D structures 110A-110D and buried gate structures 112-1A, 112-1B, and 112-1C. Buried gate structures 112-1A, 112-1B, and 112-1C can control the channel current flowing through semiconductor layer 222-1. Semiconductor layer 222-1 can electrically isolate S/D structures 110A-110D and buried gate structures 112-1A, 112-1B, and 112-1C. In some embodiments, a portion of bottom semiconductor layer 222-1 between S/D structures 110 and buried semiconductor layers 1020A and 1020B can have vertical dimension 222-1t (e.g., thicknesses) along a Z-axis ranging from about 3 nm to about 8 nm. With buried gate structures 112-1A, 112-1B, and 112-1C, semiconductor device 1100 can improve control of the channel current flowing through semiconductor layer 222-1 and reduce the off-state leakage current in semiconductor layer 222-1.

Referring to FIG. 12, top gate structure 112-5 of semiconductor device 1200 can have a length 112-5d along an X-axis ranging from about 30 nm to about 140 nm. Bottom gate structure 112-2 of semiconductor device 1200 can have a length 112-2d along an X-axis ranging from about 40 nm to about 150 nm. Buried gate structures 112-1A, 121-1B, and 121-1C of semiconductor device 1200 can have a length 112-id along an X-axis ranging from about 50 nm to about 170 nm. In some embodiments, a ratio of length 112-1d to length 112-2d can range from about 1.1 to about 1.3. If the ratio is less than about 1.1, semiconductor device 1200 may have an increased off-state leakage current. If the ratio is greater than about 1.3, semiconductor layers 222 may be damaged during removal of the first set of semiconductor layers. Semiconductor layer 222-4 of each finFET in semiconductor device 1200 can have length 222-4d* along an X-axis ranging from about 40 nm to about 150 nm. Semiconductor layers 222-3 of each finFET in semiconductor device 1200 can have length 222-3d* along an X-axis ranging from about 45 nm to about 155 nm. Semiconductor layers 222-2 of each finFET in semiconductor device 1200 can have length 222-2d* along an X-axis ranging from about 50 nm to about 160 nm.

Figure 13:
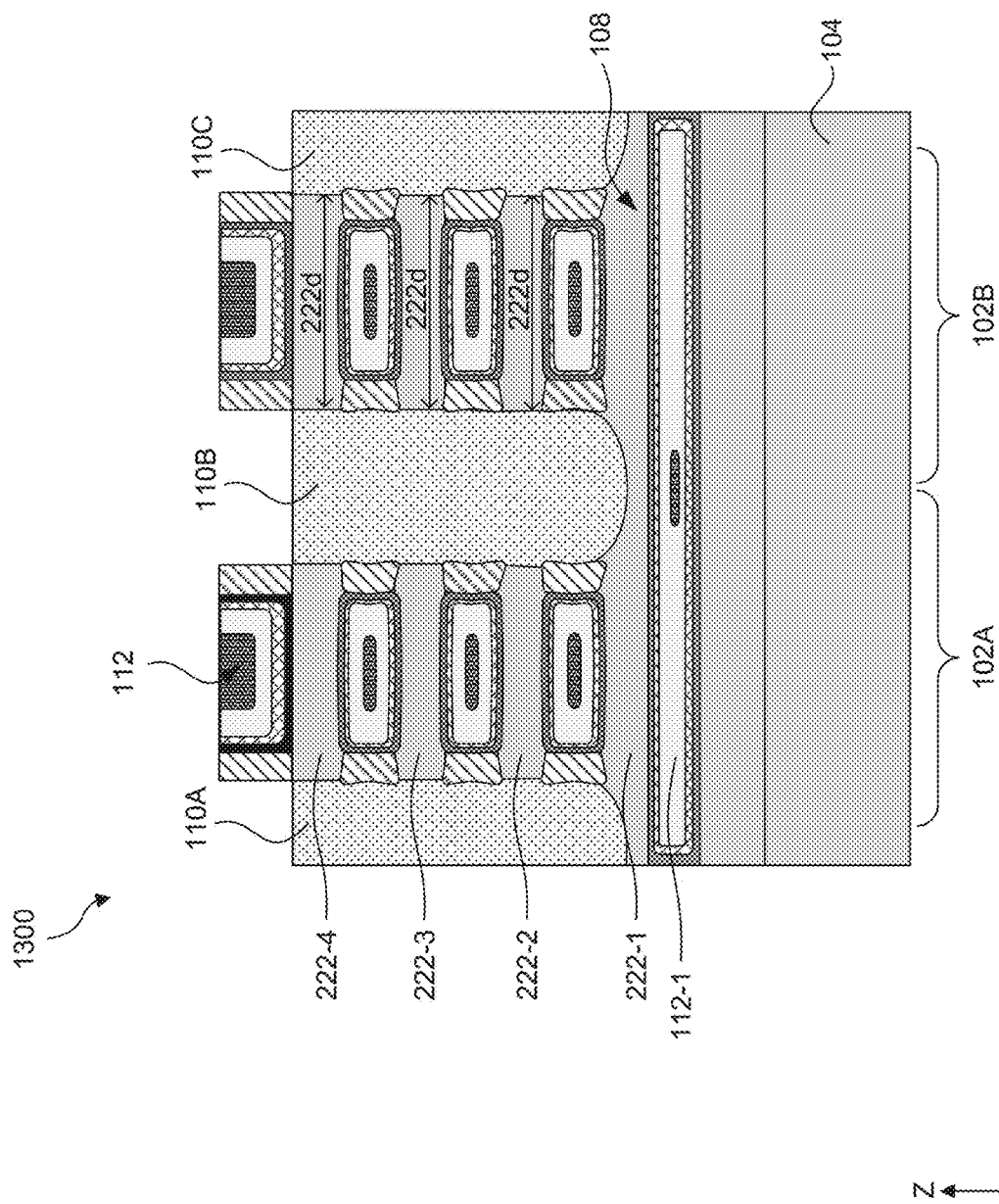

In some embodiments, an isotropic etch process can be performed after the modulated S/D regions recess to form vertical sidewalls, as shown in FIG. 13. In some embodiments, the isotropic etch process can be a dry etch process biased at a voltage from about 40 V to about 80 V. The dry etch process can include etchants, such as hydrogen ($H_2$), $CHF_3$, $CH_2F_2$, and $CH_3F$. The dry etch process can be performed at a temperature from about 40° C. to about 70° C. Referring to FIG. 13, semiconductor device 1300 having buried gate structures 112-1 can have vertical sidewalls for S/D structures 110. FIG. 13 illustrates a cross-sectional view along line A-A of finFETs 102A-102B in FIG. 1, in accordance with some embodiments. As shown in FIG. 13, buried gate structure 112-1 can be formed below semiconductor layer 222-1 and S/D structures 110. Semiconductor layers 222-4, 222-3, and 222-2 can have substantially equal length 222d along an X-axis ranging from about 15 nm to about 30 nm. With buried gate structure 112-1 and semiconductor layers 222-4, 222-3, and 222-2 having substantially equal length 222d, semiconductor device 1300 can improve control of the channel current flowing through bottom semiconductor layer 222-1 and reduce the off-state leakage current in bottom semiconductor layer 222-1.

Various embodiments in the present disclosure provide example methods for forming a buried gate structure 112-1 in semiconductor devices 100 and 900-1300 (e.g., finFETs, gate-all-around FETs, and MOSFETs) and/or other semiconductor devices in an IC. The example methods in the present disclosure can control a recess depth for S/D structures 110 of semiconductor device 100 and form buried gate structure 112-1 below bottom semiconductor layer 222-1 and S/D structures 110 of semiconductor device 100. Buried gate structure 112-1 can reduce the off-state leakage current and tune the $V_t$ of semiconductor device 100. In some embodiments, as shown in FIG. 10, two or more buried gate structures 112-1 and 112-2 can be formed below semiconductor layer 222-2 and S/D structures 110 of the FET devices by controlling the recess depth for the S/D structures 110. In some embodiments, as shown in FIG. 11, adjacent buried gate structures can be connected and one buried gate structure 112-1 can be formed below more than two S/D structures 110. In some embodiments, as shown in FIG. 12, adjacent buried gate structures 112-1A to 112-1C can be separated by buried semiconductor layers 1020A and 1020B. According to some embodiments, semiconductor devices with one buried gate structure can reduce the DIBL by about 10 mV to about 20 mV and increase $V_t$ by about 30 mV to about 50 mV.

In some embodiments, a semiconductor device includes a substrate and a fin structure on the substrate. The fin structure includes a top portion and a bottom portion. The semiconductor device further includes a gate structure on the bottom portion of the fin structure. Multiple semiconductor layers in the top portion of the fin structure are disposed on the gate structure. The semiconductor device further includes a source/drain structure above the gate structure and in contact with the multiple semiconductor layers.

In some embodiments, a semiconductor device includes a substrate including a first semiconductor material and a fin structure on the substrate. The fin structure includes a top portion and a bottom portion. The semiconductor device also includes: a semiconductor layer on the bottom portion of the fin structure; and a second semiconductor material different from the first semiconductor material and first and second gate structures on the bottom portion of the fin structure and on opposite sides of the semiconductor layer. First multiple semiconductor layers in the top portion of the fin structure are disposed on the first gate structure, and second multiple semiconductor layers are disposed in the top portion of the fin structure on the second gate structure. The semiconductor device further includes a source/drain structure above the semiconductor layer and between the first and the second multiple semiconductor layers.

In some embodiments, a method includes forming first and second sets of semiconductor layers on a substrate. The first and second sets of semiconductor layers are stacked in an alternating configuration. The first set of semiconductor layers includes a semiconductor material different from that of the substrate. The method further includes removing a portion of the first and second sets of semiconductor layers to expose a bottom semiconductor layer of the second set of semiconductor layers, forming a source/drain structure on the bottom semiconductor layer of the second set of semiconductor layers, removing the first set of semiconductor layers, and forming a gate structure below the source/drain structure and the bottom semiconductor layer of the second set of semiconductor layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin structure on the substrate, wherein the fin structure comprises a top portion and a bottom portion;
   a gate structure on the bottom portion of the fin structure, wherein a plurality of semiconductor layers in the top portion of the fin structure are disposed on the gate structure; and
   a source/drain structure above the gate structure and in contact with end surfaces of the plurality of semiconductor layers, wherein:
      a bottom surface of the source/drain structure extends into a top surface of a bottom semiconductor layer of the plurality of semiconductor layers, and
      the gate structure is vertically under the end surfaces of the plurality of semiconductor layers and the source/drain structure.

2. The semiconductor device of claim 1, wherein the bottom semiconductor layer of the plurality of semiconductor layers is disposed vertically between the gate structure and the bottom surface of the source/drain structure, and wherein a length of the bottom semiconductor layer is greater than a length of the gate structure.

3. The semiconductor device of claim 1, wherein a ratio of a distance between the source/drain structure and the gate structure to a thickness of the plurality of semiconductor layers ranges from about 0.2 to about 0.8.

4. The semiconductor device of claim 1, further comprising an additional gate structure wrapped around the plurality of semiconductor layers, wherein a length of the gate structure is greater than a length of the additional gate structure.

5. The semiconductor device of claim 4, further comprising an inner spacer structure in contact with the additional gate structure and the source/drain structure.

6. The semiconductor device of claim 1, further comprising an additional gate structure below the gate structure on the bottom portion of the fin structure.

7. The semiconductor device of claim 1, further comprising an additional plurality of semiconductor layers on the gate structure, wherein the plurality of semiconductor layers and the additional plurality of semiconductor layers are on opposite sides of the source/drain structure.

8. The semiconductor device of claim 1, wherein semiconductor layers of the plurality of semiconductor layers above the bottom semiconductor layer of the plurality of semiconductor layers have substantially equal lengths.

9. A semiconductor device, comprising:
   a gate structure on a substrate;
   a plurality of semiconductor layers on a top surface of the gate structure;
   a source/drain structure above the gate structure and in contact with the plurality of semiconductor layers, wherein the source/drain structure extends into a portion of a bottom semiconductor layer of the plurality of semiconductor layers, and wherein a bottom surface of the source/drain structure is above a top surface of the portion of the bottom semiconductor layer; and
   an inner spacer structure in contact with the source/drain structure and end portions of the plurality of semiconductor layers.

10. The semiconductor device of claim 9, wherein the source/drain structure is an epitaxial structure, and wherein the bottom semiconductor layer in the plurality of semiconductor layers is disposed vertically between the gate structure and the source/drain structure.

11. The semiconductor device of claim 9, wherein a ratio of a distance between the source/drain structure and the gate structure to a thickness of the plurality of semiconductor layers ranges from about 0.2 to about 0.8.

12. The semiconductor device of claim 9, further comprising an additional gate structure wrapped around the plurality of semiconductor layers, wherein a length of the gate structure is greater than a length of the additional gate structure, and wherein the bottom semiconductor layer comprises an additional portion vertically under the additional gate structure, a thickness of the portion of the bottom semiconductor layer being less than a thickness of the additional portion of the bottom semiconductor layer.

13. The semiconductor device of claim 12, wherein the inner spacer structure is in contact with the additional gate structure and the source/drain structure.

14. The semiconductor device of claim 9, further comprising an additional gate structure on the substrate and below the gate structure.

15. The semiconductor device of claim 9, wherein semiconductor layers of the plurality of semiconductor layers above the bottom semiconductor layer of the plurality of semiconductor layers have substantially equal lengths.

16. A semiconductor device, comprising:
   a gate structure on a substrate;
   a plurality of semiconductor layers above the gate structure; and
   first and second source/drain structures above the gate structure and extending through the plurality of semiconductor layers, wherein:
      the plurality of semiconductor layers is in contact with sidewall surfaces of the first and second source/drain structures,
      the gate structure is vertically under the first source/drain structure and the second source/drain structure, and
      a bottom semiconductor layer of the plurality of semiconductor layers separates the first and second source/drain structures from the gate structure.

17. The semiconductor device of claim 16, wherein a ratio of a distance between the first source/drain structure and the gate structure to a thickness of the plurality of semiconductor layers ranges from about 0.2 to about 0.8.

18. The semiconductor device of claim 16, further comprising an additional gate structure above the gate structure and wrapped around the plurality of semiconductor layers, wherein a length of the gate structure is greater than a length of the additional gate structure.

19. The semiconductor device of claim 18, further comprising an inner spacer structure in contact with the additional gate structure and the first source/drain structure.

20. The semiconductor device of claim 16, further comprising an additional gate structure on the substrate and below the gate structure.

* * * * *